United States Patent [19]

Savage, Jr.

[11] 4,398,240

[45] Aug. 9, 1983

[54] LENS CAP HOLDER FOR ATTACHMENT TO CIRCUIT BOARDS

[76] Inventor: John M. Savage, Jr., 8118 W. 83rd St., Apt. C, Playa del Rey, Calif. 90291

[21] Appl. No.: 57,890

[22] Filed: Jul. 16, 1979

Related U.S. Application Data

[63] Continuation-in-part of Ser. No. 907,735, May 19, 1978, Pat. No. 4,195,330, which is a continuation-in-part of Ser. No. 787,016, Apr. 13, 1977, abandoned, which is a continuation-in-part of Ser. No. 638,626, Dec. 8, 1975, abandoned.

[51] Int. Cl.³ .............................................. F21V 3/00
[52] U.S. Cl. .................................... 362/311; 362/226; 362/353; 362/355; 362/363; 362/455; 362/800
[58] Field of Search ............... 362/311, 226, 353, 355, 362/363, 455, 800

[56] References Cited

U.S. PATENT DOCUMENTS

| | | | |
|---|---|---|---|
| 835,608 | 11/1906 | Gilman . | |
| 2,599,361 | 6/1952 | Beal | 173/328 |
| 2,847,559 | 8/1958 | Harrington et al. . | |
| 2,946,994 | 7/1960 | Dumke et al. | 340/381 |
| 2,957,072 | 10/1960 | Rigel . | |
| 3,115,308 | 12/1963 | Stark | 362/23 |
| 3,207,954 | 9/1965 | Elliott | 317/99 |
| 3,229,083 | 1/1966 | George | 362/23 |
| 3,285,548 | 11/1966 | Matto et al. | 248/27 |
| 3,286,255 | 11/1966 | Sanchez | 340/381 |
| 3,396,269 | 8/1968 | Sorenson | 362/366 |
| 3,435,449 | 3/1969 | Sloan | 340/381 |
| 3,473,015 | 10/1969 | Haas et al. | 362/293 |
| 3,604,918 | 9/1971 | Cook et al. | 362/23 |
| 3,611,360 | 10/1971 | Bailey | 362/226 |
| 3,659,093 | 4/1972 | Rieth | 362/366 |
| 3,774,021 | 11/1973 | Johnson | 362/23 |
| 3,777,137 | 12/1973 | Costanzo | 362/382 |
| 3,805,347 | 4/1974 | Collins et al. | 29/25.13 |
| 3,818,486 | 6/1974 | Bailey | 340/381 |
| 3,887,803 | 6/1975 | Savage | 362/455 |
| 3,982,122 | 9/1976 | Bull et al. | 362/366 |
| 4,035,681 | 7/1977 | Savage | 313/110 |
| 4,195,330 | 3/1980 | Savage | 362/800 |

FOREIGN PATENT DOCUMENTS

| | | |
|---|---|---|
| 1360727 | 4/1964 | France . |
| 2126650 | 6/1972 | France . |
| 1043359 | 9/1966 | United Kingdom . |

*Primary Examiner*—Stephen J. Lechert, Jr.
*Attorney, Agent, or Firm*—William W. Haefliger

[57] ABSTRACT

A mount for an LED and lens cap enables attachment of these components to a circuit board, the LED wires retaining the LED, cap and mount to the board. The mount typically includes:

(a) a holder having first and second sections, (b) said sections having shoulders to engage and support the lens cap when the sections are assembled to the skirt portion of the cap, (c) the holder having recesses to pass said wire leads from the interior to the exterior of the holder when the sections are assembled to the skirt portion of the cap.

20 Claims, 8 Drawing Figures

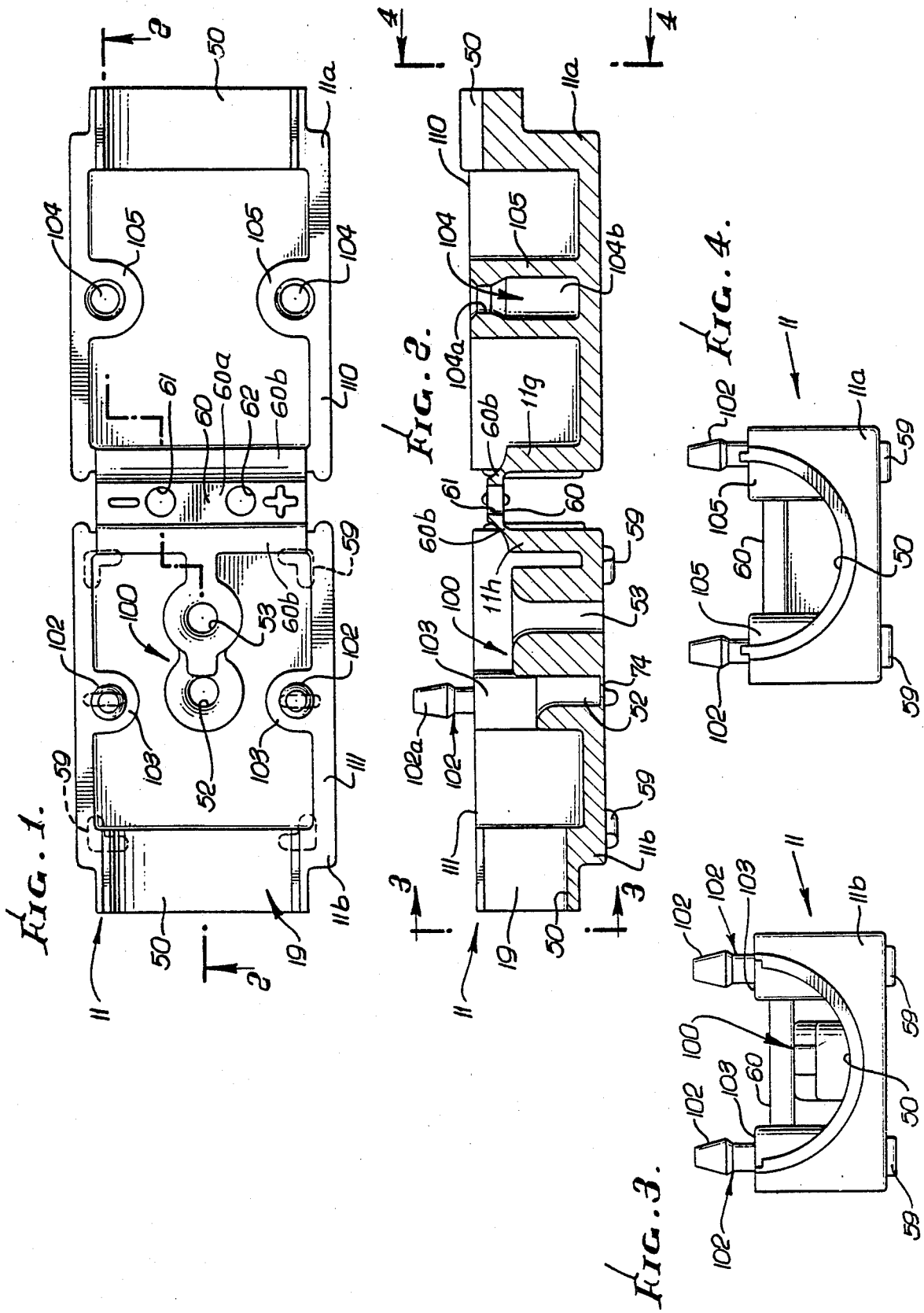

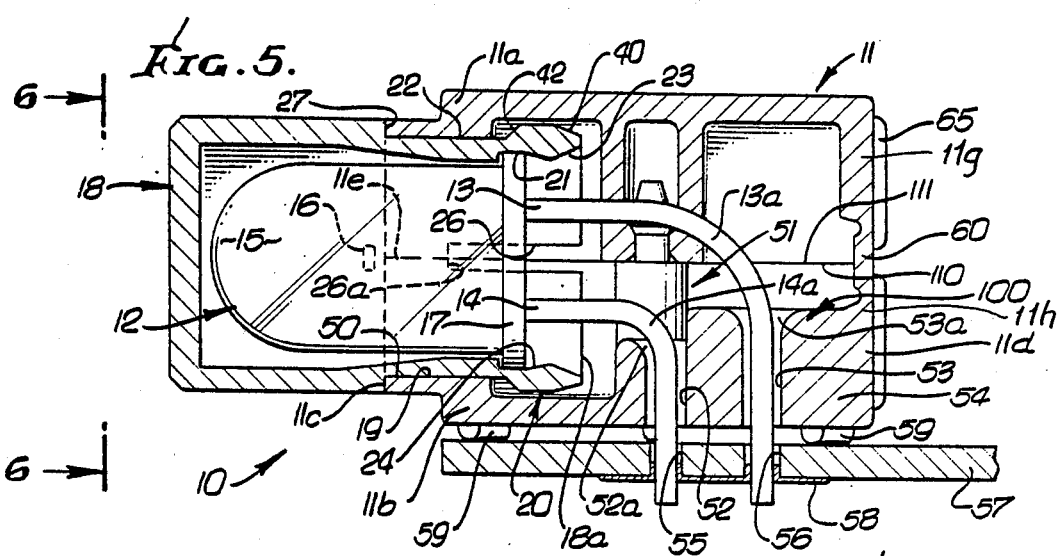

LENS CAP HOLDER FOR ATTACHMENT TO CIRCUIT BOARDS

BACKGROUND OF THE INVENTION

This application is a continuation-in-part of my co-pending application Ser. No. 907,735, filed May 19, 1978, now U.S. Pat. No. 4,195,330, which was a continuation-in-part of my earlier application Ser. No. 787,016, filed Apr. 13, 1977, which was a continuation-in-part of earlier Ser. No. 638,626 filed Dec. 8, 1975, both now abandoned.

This invention relates generally to the mounting of light emitting diodes and similar devices; more particulary it concerns a method and means of mounting an LED to a circuit board in such manner as to obviate unintentional transmission of static electricity to board circuit paths.

It has been observed that circuit boards carrying LEDs were often subjected to unintended transmission of electricity to and along circuit paths on the boards. Such transmission was accompanied by destructively high voltage, which deactivated or damaged sensitive electrical components such as transistors, and LSI devices. Applicant has discovered that the source of such voltage in many cases was static electricity developed on the user or technician, and transmitted to the circuits on the board via LED's which the user frequently touched. Such LED's are commonly located on circuit boards to signal, by illumination, the activation of selected circuits. It is believed arcing occurred between the LED protective surface touched by the user, and the interior wiring within the LED, thereby transmitting voltage to circuits connected with such wiring.

SUMMARY OF THE INVENTION

It is a major object of the invention to provide means to protect against the occurrence of such unwanted and damaging voltage application to circuit paths on a board carrying LED's. Basically, the invention is embodied in the provision of a protective lens cap receiving the LED, and a protective holder mounting the cap and protectively enclosing the LED leads between their points of exit from the LED and entrance to and through the circuit board. Also, the holder is adapted to mount to and on the circuit board, with the leads themselves acting to retain the holder in position on the board, as will be seen, whereby the holder, leads and lens cap interact in several different cooperative modes to achieve the ultimate objectives.

Basically, the invention is embodied in a combination that includes:

(a) a holder having first and second sections, (b) said sections having shoulders to engage and support the lens cap when the sections are assembled to the skirt portion of the cap, (c) the holder having recesses to pass the wire leads from the interior to the exterior of the holder when the sections are assembled to the skirt portion of the cap.

As will be seen, the holder may include a hinge interconnecting the sections to be swung or closed relatively toward one another for assembly to the skirt portion of the cap; the assembly is such that retention loading keeping the holder on the circuit board is transmitted via the leads, the LED, cap fingers (to which the LED is pre-assembled) and the holder itself. Further, the holder may include an end-wall-hinge interconnecting the sections to be swung together as described, and whereby a one-piece molded plastic, insulative holder is achieved; and that hinge may contain alternate openings to pass the leads, as when endwise-mounting of the holder on a circuit board is to be accomplished. Finally, snap-together tongue and groove connections may be provided on the sections to facilitate their rapid assembly to a lens cap carrying an LED.

These and other objects and advantages of the invention, as well as the details of illustrative embodiments, will be more fully understood from the following description and drawings, in which:

DRAWING DESCRIPTION

FIG. 1 is a top plan view of a lens cap holder in as-formed condition;

FIG. 2 is a sectional elevation taken on lines 2—2 of FIG. 1;

FIG. 3 is a left end elevation on lines 3—3 of FIG. 2;

FIG. 4 is a right end elevation taken on lines 4—4 of FIG. 2;

FIG. 5 is a sectional elevation showing the FIG. 1 holder closed on a lens cap unit and side mounted on a circuit board;

FIG. 6 is a left end elevation on lines 6—6 of FIG. 5;

FIG. 7 is a side elevation showing end mounting of a FIG. 1 type holder on a circuit board; and FIG. 8 is a top plan view on lines 8—8 of FIG. 7.

DETAILED DESCRIPTION

The light emitting diode assembly 10 seen in FIG. 5 is attached to holder 11. The LED 12 includes terminals 13 and 14 projecting rearwardly from housing 15, and also within the latter. A luminous chip 16 defines the light emitting zone of the LED. The LED also includes locking structure, as for example arcuate boss or flange section 17.

The assembly also includes a lens cap 18 receiving the diode, and clip means integral with the cap projecting proximate the LED locking structure. The lens cap projects axially leftwardly, and the diode 12 projects axially forwardly through a round opening 19 formed by the sections 11a and 11b of the holder, such sections being jaw-like to close together and abut at 11e. Holder section arcuate shoulders 50 then engage and support the lens cap. The clip means may with unusual advantage comprise spring fingers 20 projecting rearwardly through opening 19 at the outer side of the diode; further, the spring fingers have tongue and groove interfit with the diode. The illustrated interfit or releasable interconnection is defined by the reception of the radially projecting boss 17 into first grooves 21 defined by cantilevered extents of the fingers projecting rearwardly of the panel 11. Note that the spring fingers also define second grooves 22 receiving the semi-circular, jaw like sections 11a and 11b of the holder, adjacent the circular opening 19.

The fingers 20 further define first cam surfaces 23 located rearwardly of the grooves 21 to be radially spread by the diode boss 17 in response to forward insertion of the diode into the cap. Surfaces 23 are angled rearwardly and radially outwardly, as shown. In addition the fingers define second cam surfaces 24 immediately rearward of the grooves 21 and angled rearwardly and radially inwardly to be radially spread apart by the diode boss 17 in response to relatively rearward retraction of the diode from the cap.

It should be noted that four spring fingers 20 may be provided by forming four lengthwise extending slits 26 in the skirt portion of the cap, at 90° intervals about the cap axis. The slits extend forwardly or leftwardly from the rightward end 18a of the cap. The leftward ends 26a of the slits terminate within the bore or opening 19 in the holder, and to the right of an annular cap shoulder 27 which seats against the projecting ends 11c of the holder sections. In that position, the cap holds the diode itself.

FIG. 5 also shows that the spring fingers 20 define third cam surfaces 40 rearwardly of the second grooves 22, and angled rearwardly and radially inwardly, and also fourth cam surfaces 42 rearwardly of and adjacent the grooves 22, surfaces 42 being angled rearwardly and radially outwardly. Accordingly, the spring fingers accommodate ready installation of the lens cap 18 to holder 11, as well as retention of the flange section 17.

The lens cap and clip means described herein, and the holder 11 typically consist of insulative plastic material.

Referring now to the construction of the holder, the holder 11 passes the wire leads 13 and 14 from the interior 51 to the exterior of the holder when the sections 11a and 11b are assembled to the skirt portion of the lens cap, as described. In the example shown in FIG. 5, side recesses 52 and 53 are formed in wall 54 of section 11b, whereby the wire leads may then project through openings 55 and 56 in a circuit board 57. This facilitates attachment of the assembly to the circuit board, as by means of solder 58 penetrating the openings 55 and 56 and attaching to the leads, as shown. Bosses 59 on the exterior of the side wall 54 engage the board and space the holder 11 from that wall, for cooling, and for solder flux washing purpose. Note that wall 54 carries an internal boss 100 that is increasingly thickened toward the end 11d of the holder, for strengtening the mounting section 11b, and also to space the bends 13a and 14a in the wire leads from the LED itself. Note also the divergent entrances 52a and 53a to the recesses or openings 52 and 53 in boss 100.

The holder 11 also includes a hinge 60 in the end of the holder remote from the LED, that hinge facilitating folding together of the sections 11a and 11b from their initial, as-molded, in-line condition seen in FIGS. 1 and 2. The hinge is typically molded with, and to interconnect the sections 11a and 11b providing a one-piece plastic construction. FIG. 1 shows the hinge to contain and define through ports or recesses 61 and 62, to provide optionally or alternatively usable passages for the leads 13 and 14, in FIG. 7 mode. As there shown, the holder 11 is end-mounted on the circuit board 57a. Spacers or bosses 64 and 65 on the holder space the end of the holder from the board, and the wire leads 13 and 14 pass through board openings 55a and 56a, like openings 55 and 56 in FIG. 5. Solder 58a connects the leads to the board, thus holding the holder to the board via the LED. Holding force is transmitted via leads 13 and 14, LED boss 17, shoulders 21 and 24 on fingers 20, lens cap 18a, and to holder sections 11a and 11b. End wall 160 corresponds to end wall 60 in FIG. 5.

Note also in FIGS. 7 and 8 that the lens cap 18a has a rectangular or square cross section in planes normal to main axis 69, FIG. 8 best showing this outline. Thus, the side walls 70 of the cap are flat and parallel to axis 69. Also, the jaw like sections 11aa and 11bb of the holder are channel shaped rather than semi-circular.

The disclosed side wall recesses 52 and 53, and end wall recesses 61 and 62, may initially receive punch-out closures or webs, enabling the user to optionally open-up recesses 52 and 53 and leave recesses 61 and 62 closed, or vice versa. FIG. 2 shows such a web 74 initially closing opening 52, by way of illustration.

Finally, interfitting tongue and groove connections may be provided on the sections 11a and 11b to be interconnected when the sections are assembled to the skirt portion of the cap 18, for locking the sections together, thereby holding the cap fingers assembled to the LED flange 17. Such tongue and groove connections may advantageously comprise two plug elements 102 projecting in parallel relation from laterally opposed bosses 103 integral with section 11b, and two receptacle elements 104 sunk in corresponding, laterally opposed bosses 105 integral with section 11a. The projections have enlarged heads 102a tapered endwise to push through restricted entrances 104a to the receptacles and snap into the enlarged interiors 104b of those recesses, for firm retention. The construction is such that the two sections are held tightly together along their planar interfaces 110 and 111 in FIGS. 2 and 5.

As shown in the drawings, and referring again to the hinge 60, it integrally interconnects the two plastic semi-circular wall sections 11g and 11h, and it includes an intermediate flat or planar portion 60a and two reduced thickness webs 60b respectively integrally interconnecting the intermediate portion with wall sections 11g and 11h. Those wall sections and the hinge together define the end wall of the holder or container 11, as seen in FIG. 5, showing the hinge in double folded condition and flat. The rectangular, planar configuration of the hinge intermediate portion 60a facilitates the location of openings 61 and 62, as seen in FIGS. 1 and 2. Note that the thickness of the intermediate portion 60a is less than the thickness of the wall sections 11g and 11h, as shown.

The lens cap described herein as further described in my co-pending application Ser. No. 907,735, filed May 19, 1978.

I claim:

1. For combination with an LED and a lens cap therefor, the lens cap having a skirt portion supporting the LED, there being wire leads extending from the LED, the combination comprising
   (a) a holder having first and second sections,
   (b) said sections having shoulders to engage and support the lens cap when the sections are assembled to the skirt portion of the cap,
   (c) the holder having recesses to pass said wire leads from the interior to the exterior of the holder when the sections are assembled to the skirt portion of the cap.

2. The combination of claim 1 wherein said holder includes a hinge interconnecting said sections to be swung relatively toward one another for assembly to the skirt portion of the cap.

3. The combination of claim 2 wherein said sections and hinge are of one-piece, molded plastic construction.

4. The combination of claim 3 wherein said recesses are located at said hinge.

5. The combination of claim 3 wherein said recesses form openings extending through said hinge.

6. The combination of claim 3 wherein said recesses are at the hinge and are covered, to form openings extending through said hinge when the hinge is locally fractured.

7. The combination of claim 3 wherein said recesses are located at a side wall defined by one of the sections.

8. The combination of claim 7 wherein said recesses form openings extending through said side wall.

9. The combination of claim 7 wherein said recesses are covered to form openings through said side wall when the side wall is locally fractured.

10. The combination of claim 1 including interfittable tongue and groove connections on the respective sections to be interconnected when the sections are assembled to the skirt portion of the cap for locking the sections together.

11. The combination of claim 10 wherein the tongue and groove connections include plug and receptacle elements, the sections having generally semi-cylindrical walls with axially extending edges, and said plug and receptacle elements located proximate said edges.

12. The combination of claim 11 wherein the holder includes a hinge interconnecting said sections at an end of the holder intersected by a central axis defined by said semi-cylindrical walls.

13. The combination of any one of claims 1 through 12 including said lens cap to which the sections are assembled.

14. The combination of claim 5 and including said LED with said leads extending through said openings, the LED having a flange and the cap having fingers retained to the flange by said sections.

15. The combination of claim 8 and including said LED with said leads extending through said openings.

16. The combination of any one of claims 1-12, 14 and 15 including said lens cap to which the sections are assembled, said lens cap having a circular cross section in a plane normal to a central axis defined by the lens cap.

17. The combination of any one of claims 1-12, 14 and 15 including said lens cap to which the sections are assembled, said lens cap having a generally rectangular cross section in a plane normal to a central axis defined by the lens cap.

18. The combination of any one of claims 1-12, 14 and 15 including means on the holder to space the holder from a circuit board.

19. The combination of either one of claims 14 and 15 including a circuit board having openings therethrough passing said leads, and solder connecting the leads to the board to retain the holder positioned at one side of the board.

20. In combination:
(a) an LED having protruding wires,
(b) a lens cap on the LED,
(c) a holder extending about and supporting portions of the LED and cap in assembled condition,
(d) the holder having openings passing the LED wires for attachment to a circuit board to retain the LED, cap and holder to the board.

* * * * *